US012740303B2

United States Patent

(12) United States Patent
Yang et al.

(10) Patent No.: US 12,740,303 B2
(45) Date of Patent: Sep. 15, 2026

(54) DISPLAY SUBSTRATE, MANUFACTURING METHOD THEREOF AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Xiaoyan Yang, Beijing (CN); Yuqing Yang, Beijing (CN); Xiping Li, Beijing (CN); Huiyang Yu, Beijing (CN); Fengxia Tan, Beijing (CN); Yong Zhuo, Beijing (CN); Hui Li, Beijing (CN); Wei Zhang, Beijing (CN); Jonguk Kwak, Beijing (CN); Shicheng Sun, Beijing (CN); Xinwei Wu, Beijing (CN); Cunzhi Li, Beijing (CN); Dongsheng Zhao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 770 days.

(21) Appl. No.: 17/779,369

(22) PCT Filed: Jul. 14, 2021

(86) PCT No.: PCT/CN2021/106199

§ 371 (c)(1),
(2) Date: May 24, 2022

(87) PCT Pub. No.: WO2022/042108

PCT Pub. Date: Mar. 3, 2022

(65) Prior Publication Data

US 2022/0399413 A1 Dec. 15, 2022

(30) Foreign Application Priority Data

Aug. 31, 2020 (CN) ......................... 202010897899.7

(51) Int. Cl.
*H10K 59/88* (2023.01)
*H10K 59/122* (2023.01)
(Continued)

(52) U.S. Cl.
CPC ........... *H10K 59/88* (2023.02); *H10K 59/122* (2023.02); *H10K 59/131* (2023.02);
(Continued)

(58) Field of Classification Search
CPC .... H10K 71/135; H10K 50/84; H10K 59/122; H10K 71/00; H10K 59/88; H10K 59/131;
(Continued)

(56) References Cited

U.S. PATENT DOCUMENTS 10,916,602 B2 * 2/2021 Yu ........................ H10K 71/135
11,527,738 B2 * 12/2022 Zhang ................. H10K 59/131
(Continued)

FOREIGN PATENT DOCUMENTS

CN 106409869 A 2/2017
CN 107887417 A 4/2018
(Continued)

OTHER PUBLICATIONS

Qin, CN 109801956 A, Machine Translation (Year: 2019).*
Office Action dated Sep. 9, 2023 issued in corresponding Chinese Application No. 202010897899.7.

*Primary Examiner* — Alonzo Chambliss
(74) *Attorney, Agent, or Firm* — Nath, Goldberg & Meyer; Joshua B. Goldberg

(57) ABSTRACT

The present disclosure provides a display substrate, including: a base substrate having an opening region, a transition
(Continued)

region surrounding the opening region and a pixel region surrounding the opening region; at least one ink-jet printing dam in the transition region and surrounding the opening region; and at least one conductive film layer in the transition region, where an orthographic projection of the conductive film layer on the base substrate is overlapped with an orthographic projection of the ink-jet printing dam on the base substrate. In the technical solution of the present disclosure, the conductive film layer is intended to absorb and conduct heat, so as to reduce the heat on the ink-jet printing dam.

20 Claims, 8 Drawing Sheets

(51) Int. Cl.
*H10K 59/131* (2023.01)
*H10K 59/80* (2023.01)
*H10K 71/13* (2023.01)
*H10K 59/65* (2023.01)

(52) U.S. Cl.
CPC ....... *H10K 59/8794* (2023.02); *H10K 71/135* (2023.02); *H10K 59/65* (2023.02); *H10K 59/8731* (2023.02)

(58) Field of Classification Search
CPC . H10K 59/8794; H10K 59/8731; H10K 59/65
See application file for complete search history.

(56) References Cited

U.S. PATENT DOCUMENTS

| | | | | |
|---|---|---|---|---|
| 12,225,779 | B2 * | 2/2025 | Wang | H10K 59/123 |
| 2017/0110532 | A1 * | 4/2017 | Kim | H10K 59/124 |
| 2020/0136088 | A1 | 4/2020 | Yang et al. | |
| 2020/0185647 | A1 * | 6/2020 | Lee | H10K 59/8731 |

FOREIGN PATENT DOCUMENTS

| | | | | | |
|---|---|---|---|---|---|
| CN | 107919293 | A | | 4/2018 | |
| CN | 207719213 | U | | 8/2018 | |
| CN | 109616506 | A | | 4/2019 | |
| CN | 109801956 | A | * | 5/2019 | H01L 27/3246 |
| CN | 112133727 | A | | 12/2020 | |

* cited by examiner

DISPLAY SUBSTRATE, MANUFACTURING METHOD THEREOF AND DISPLAY DEVICE

CROSS-REFERENCE TO RELATED APPLICATION

This is a National Phase Application filed under 35 U.S.C. 371 as a national stage of PCT/CN2021/106199, filed on Jul. 14, 2021, an application claiming the benefit of Chinese Patent Application No. 202010897899.7 filed on Aug. 31, 2020 the contents of which are incorporated herein in their entirety by reference.

TECHNICAL FIELD

The present disclosure relates to the field of display, in particular to a display substrate, a manufacturing method thereof and a display device.

BACKGROUND

With the development of display technology, a series of special-shaped display screens are developed to realize higher screen-to-body ratio, such as "notch screen", "water drop screen" and "hole-punch screen" that are popular on the market. Among these screens, the "hole-punch screen" refers to a display screen of which the display region (also referred to as region AA) includes a physical hole. The region in which the physical hole is located may also be referred to as an opening region. The display region further includes a transition region surrounding the opening region and a pixel region surrounding the transition region. In practical applications, it is found that the film layer structure in the transition region is prone to a peeling problem, which results in a low product yield.

SUMMARY

The present disclosure aims to solve at least solve one of the technical problems in the existing technology, and provides a display substrate, a manufacturing method thereof and a display device.

In a first aspect, an embodiment of the present disclosure provides a display substrate, including:

a base substrate having an opening region, a transition region surrounding the opening region and a pixel region surrounding the opening region;

at least one ink-jet printing dam in the transition region, the at least one ink-jet printing dam surrounding the opening region; and at least one conductive film layer in the transition region, wherein an orthographic projection of the conductive film layer on the base substrate is overlapped with an orthographic projection of the ink-jet printing dam on the base substrate.

In some embodiments, the orthographic projection of the conductive film layer on the base substrate and the orthographic projection of the ink-jet printing dam on the base substrate are completely overlapped with each other; or the orthographic projection of the ink-jet printing dam on the base substrate is within a region enclosed by the orthographic projection of the conductive film layer on the base substrate.

In some embodiments, the display substrate further includes:

a thin film transistor in the pixel region;

a planarization layer on a side of the thin film transistor facing away from the base substrate;

a first electrode on a side of the planarization layer facing away from the base substrate; and a pixel defining layer on a side of the first electrode facing away from the base substrate.

In some embodiments, the ink-jet printing dam includes:

a first deposition film layer, which is made of the same material and disposed in the same layer as the planarization layer; and/or a second deposition film layer, which is made of the same material and disposed in the same layer as the pixel defining layer.

In some embodiments, the display panel further includes:

a spacer dam on a side of the pixel defining layer facing away from the base substrate; and the ink-jet printing dam further includes:

a third deposition film layer, which is made of the same material and disposed in the same layer as the spacer dam.

In some embodiments, the at least one conductive film layer includes: at least one first conductive film layer, which is made of the same material and disposed in the same layer as one of a gate electrode, a source/drain electrode, an active layer and a capacitor plate layer of the thin film transistor.

In some embodiments, the at least one conductive film layer includes: a second conductive film layer, which is made of the same material and disposed in the same layer as the first electrode.

In some embodiments, the at least one conductive film layer includes: at least one first conductive film layer and a second conductive film layer, the first conductive film layer is made of the same material and disposed in the same layer as one of a gate electrode, a source/drain electrode, an active layer and a capacitor plate layer of the thin film transistor; and the second conductive film layer is made of the same material and is disposed in the same layer as the first electrode.

In some embodiments, a pixel accommodation hole is formed in the pixel defining layer, and the display substrate further includes:

an organic functional layer in the pixel accommodation hole;

a second electrode on a side of the organic functional layer facing away from the base substrate; and an encapsulation layer on a side of the second electrode facing away from the base substrate.

In some embodiments, the ink-jet printing dam includes: a first ink-jet printing sub-dam and a second ink-jet printing sub-dam; the second ink-jet printing sub-dam surrounds the opening region, and the first ink-jet printing sub-dam is on a side of the second ink-jet printing sub-dam facing away from the opening region and surrounds the second ink-jet printing sub-dam; and a first distance between a surface of the first ink-jet printing sub-dam facing away from the base substrate and the base substrate, is smaller than a second distance between a surface of the second ink-jet printing sub-dam facing away from the base substrate and the base substrate.

In some embodiments, the first ink-jet printing sub-dam and the second ink-jet printing sub-dam are spaced apart from each other, and the ink-jet printing dam further includes: a region between the first ink-jet printing sub-dam and the second ink-jet printing sub-dam; and the orthographic projection of the conductive film layer on the base substrate is between an orthographic projection of the first ink-jet printing sub-dam on the base substrate and an orthographic projection of the second ink-jet printing sub-dam on the base substrate.

In a second aspect, an embodiment of the present disclosure further provides a display device, including the display substrate according to the first aspect.

In a third aspect, an embodiment of the present disclosure further provides a method of manufacturing a display substrate, including:

providing a base substrate having an opening region, a transition region surrounding the opening region and a pixel region surrounding the opening region;

forming at least one ink-jet printing dam on the base substrate, the at least one ink-jet printing dam being in the transition region and surrounding the opening region; and forming at least one conductive film layer on the base substrate, the conductive film layer being in the transition region, wherein an orthographic projection of the conductive film layer on the base substrate is overlapped with an orthographic projection of the ink-jet printing dam on the base substrate.

DETAIL DESCRIPTION OF EMBODIMENTS

In order to make those skilled in the art better understand the technical solutions of the present disclosure, a display substrate, a manufacturing method thereof, and a display device according to the present disclosure are described in detail below with reference to the accompanying drawings.

In the related art, after the formation of the respective functional film layers is completed in the pixel region, the pixel region needs to be encapsulated, and an organic encapsulation film needs to be formed by an ink-jet printing (IJP) process during the encapsulation process. In order to ensure the encapsulation yield, an ink-jet printing dam (IJP dam) is generally formed in the transition region to block the ink from flowing to the opening region during the IJP process. Generally, the ink-jet printing dam is formed by depositing an organic material and has a certain thickness.

After the manufacturing of the display substrate is completed, the base substrate needs to be separated from the glass substrate by a laser lift-off process. In the laser lift-off process, an ink-jet printing dam having a large thickness would easily absorb more energy to generate outgas, which would cause a peeling phenomenon at corners of the ink-jet printing dam, resulting in growing dark spots in the display screen, even failure of the display screen in severe cases, thereby affecting the product yield.

Figure 1A:
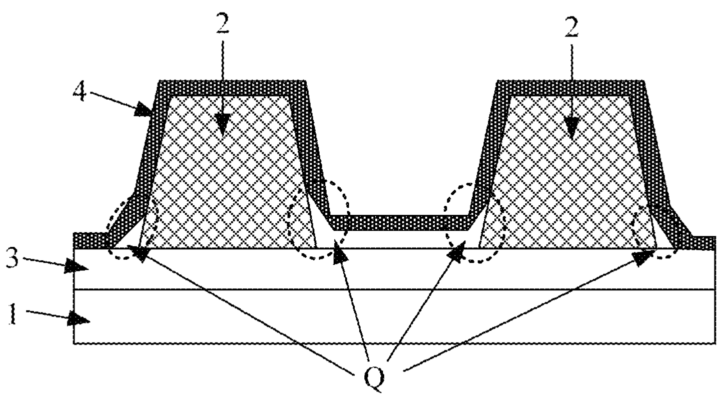
FIG. 1*a* is a schematic structural diagram of a transition region of a display substrate in the related art.
Figure 1B:
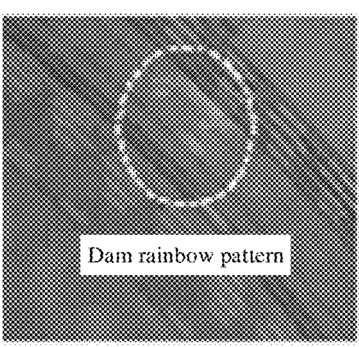
FIG. 1*b* is a schematic diagram showing a rainbow pattern present in a transition region.

FIG. 1*a* is a schematic structural diagram of a transition region of a display substrate in the related art, and FIG. 1*b* is a schematic diagram showing a rainbow pattern present in a transition region. As shown in FIGS. 1*a* and 1*b*, in the related art, at least one ink-jet printing dam 2 is formed in a transition region A2, and other film layers 3 are disposed between the ink-jet printing dam 2 and a base substrate 1. The ink-jet printing dam 2 is formed by depositing an organic material and has a certain thickness. In the laser lift-off process, the ink-jet printing dam 2 having a large thickness would easily absorb more energy to generate outgas, and the outgas causes bulge in the film layer 4 that covers the surface of the ink-jet printing dam 2, resulting in peeling of the film layer 4 at corners Q of the ink-jet printing dam 2, thereby causing growing dark spots in the display screen.

In the case shown in FIGS. 1*a* and 1*b*, two ink-jet printing dams 2 are exemplarily shown, the peeling phenomenon occurs at the corners of both the two ink-jet printing dams 2, and the peeled film layer 4 is pulled by stress, resulting in an obvious rainbow pattern (also referred to as dam rainbow pattern) between the two ink-jet printing dams 2, and in a severe case, the film layer 4 is completely peeled off, affecting the product yield.

Figure 2A:
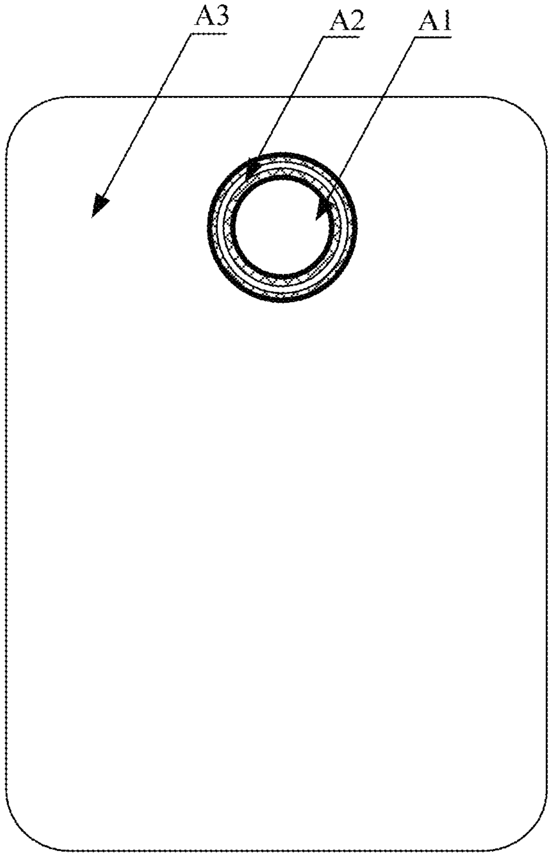
FIG. 2*a* is a schematic top view of a display substrate according to an embodiment of the present disclosure.
Figure 2B:
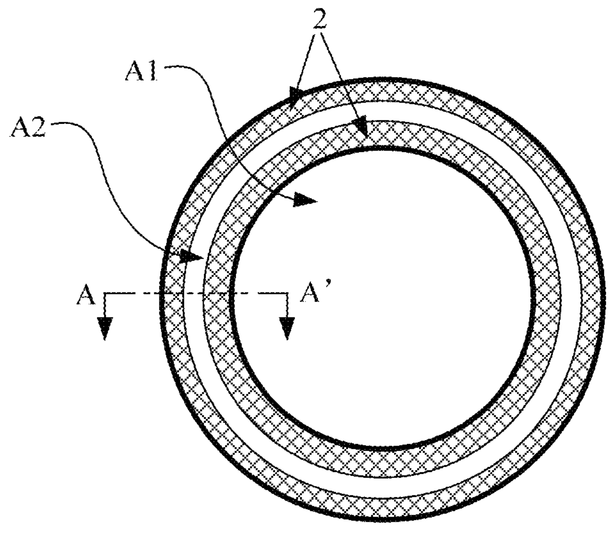
FIG. 2*b* is an enlarged schematic diagram of the transition region as shown in FIG. 2*a;*
Figure 3:
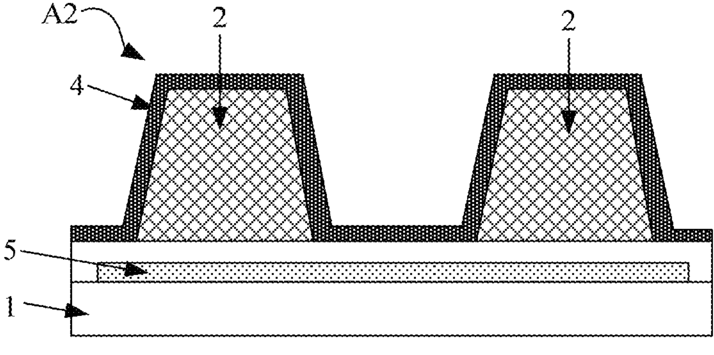
FIG. 3 is a schematic cross-sectional view taken along line A-A' in FIG. 2*b;*

In order to solve the above technical problem, embodiments of the present disclosure provide corresponding solutions. FIG. 2*a* is a schematic top view of a display substrate according to an embodiment of the present disclosure, FIG. 2*b* is an enlarged schematic diagram of the transition region as shown in FIG. 2*a*, and FIG. 3 is a schematic cross-sectional view taken along line A-A' in FIG. 2*b*. As shown in FIGS. 2*a* to 3, the display substrate includes: a base substrate 1, at least one ink-jet printing dam 2 and at least one conductive film layer 5.

The base substrate 1 has an opening region A1, a transition region A2 surrounding the opening region A1, and a pixel region A3 surrounding the opening region A1. The opening region A1 is a region formed with a physical hole, the physical hole may be formed by laser cutting, and a camera and/or a sensor structure may be disposed under the physical hole. The opening region A1 may have a regular or irregular shape, such as a circle, an ellipse, a triangle, a rectangle, and a polygon, etc. The shape of the opening region A1 is not limited in the technical solutions of the present disclosure. In some embodiments, the base substrate 1 is a flexible substrate.

The ink-jet printing dam 2 is located in the transition region A2 and surrounds the opening region A1, and is configured to, on one hand, block ink from flowing to the opening region A1 in the IJP process, and on the other hand, prevent impurities such as moisture and oxygen in the outside air from intruding into the pixel region A3 in the process of cutting and forming the physical hole. One or more ink-jet printing dams 2 may be disposed in the transition region A2, and the number of the ink-jet printing dams may be designed according to actual needs. The case of two ink-jet printing dams 2 is exemplarily shown in FIGS. 2*a* and 3.

The conductive film layer 5 is located in the transition region A2. The orthographic projection of the conductive film layer 5 on the base substrate 1 is overlapped with the orthographic projection of the ink-jet printing dam 2 on the base substrate 1. The conductive film layer 5 is configured to absorb and conduct heat so as to reduce the heat on the ink-jet printing dam 2.

In the laser lift-off process, due to the presence of the conductive film layer 5, which can absorb the surrounding heat, the heat absorbed by the ink-jet printing dam 2 is reduced (i.e. the heat on the ink-jet printing dam 2 is reduced), and thus the amount of outgas of the ink-jet printing dam 2 is reduced or even there is no outgas, thereby effectively avoiding a peeling phenomenon of the film layer 4 at the ink-jet printing dam 2, and increasing the product yield.

In an embodiment of the present disclosure, the heat on the ink-jet printing dam 2 may be reduced by the conductive film layer 5 in the following two ways: one is that the conductive film layer 5 is located between the ink-jet printing dam 2 and the base substrate 1, and can block and absorb part of laser (energy) in the laser lift-off process, so that the energy reaching the ink-jet printing dam 2 is reduced, thus the energy absorbed by the ink-jet printing dam is reduced, and the heat on the ink-jet printing dam 2 is reduced; the other is that the conductive film layer 5 is in direct contact with the ink-jet printing dam 2, so that heat conduction is achieved by direct contact so as to reduce the heat on the ink-jet printing dam 2. FIG. 3 exemplarily shows a case where the conductive film layer 5 is located between the ink-jet printing dam 2 and the base substrate 1. In the following embodiments, two specific implementations for reducing heat on the ink-jet printing dam 2 will be described in detail.

In some embodiments, the orthographic projection of the conductive film layer 5 on the base substrate 1 and the orthographic projection of the ink-jet printing dam 2 on the base substrate 1 are completely overlapped with each other. In practical applications, it is found that the peeling starts at the position of the ink-jet printing dam 2. Therefore, the orthographic projection of the conductive film layer 5 on the base substrate 1 and the orthographic projection of the ink-jet printing dam 2 on the base substrate 1 are designed to be completely overlapped with each other, which can radically reduce the heat on the ink-jet printing dam 2.

In some embodiments, the orthographic projection of the ink-jet printing dam 2 on the base substrate 1 is located within a region enclosed by the orthographic projection of the conductive film layer 5 on the base substrate 1. That is, the orthographic projection of the conductive film layer 5 on the base substrate 1 fully covers the orthographic projection of the ink-jet printing dam 2 on the base substrate 1. When the area of the orthographic projection of the conductive film layer 5 on the base substrate 1 is larger than that of the ink-jet printing dam 2 on the base substrate 1, the orthographic projection of the conductive film layer 5 on the base substrate 1 not only fully covers the orthographic projection of the ink-jet printing dam 2 on the base substrate 1, but also covers the orthographic projection of the peripheral portion of the ink-jet printing dam 2 on the base substrate 1. In this case, the heat conduction effect is better, and the heat on the ink-jet printing dam 2 can be further reduced. Illustratively, the orthographic projection of the conductive film layer 5 on the base substrate 1 is overlapped with the transition region A2.

The above cases are merely exemplary, and do not limit the technical solutions of the present disclosure. In an embodiment of the present disclosure, the heat on the ink-jet printing dam 2 can be reduced to a certain extent as long as the orthographic projection of the conductive film layer 5 on the base substrate 1 is overlapped with the orthographic projection of the ink-jet printing dam 2 on the base substrate 1.

Figures 4, 5:
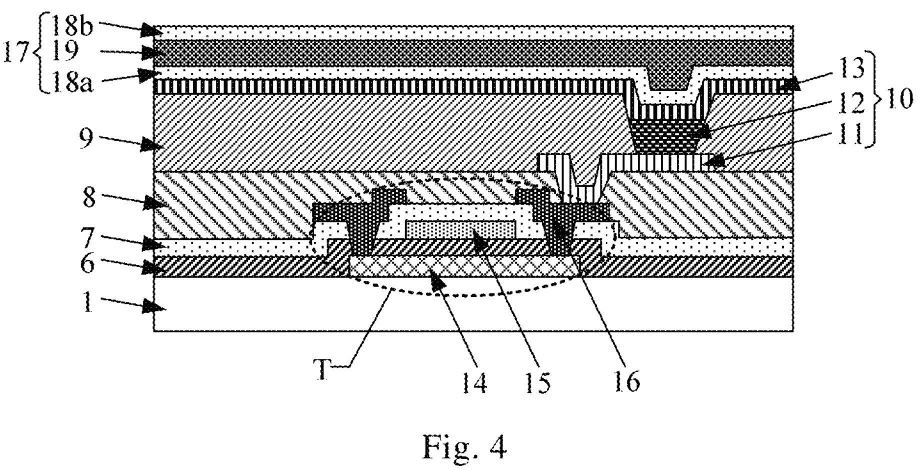
FIG. 4 is a schematic cross-sectional view of a portion of a pixel region according to an embodiment of the present disclosure.
FIG. 5 is another schematic cross-sectional view of a portion of the pixel region according to an embodiment of the present disclosure.

FIG. 4 is a schematic cross-sectional view of a portion of a pixel region according to an embodiment of the present disclosure. As shown in FIG. 4, a thin film transistor T, a planarization layer 8 on a side of the thin film transistor T facing away from the base substrate 1, a first electrode 11 on a side of the planarization layer 8 facing away from the base substrate 1, and a pixel defining layer 9 on a side of the planarization layer 8 facing away from the base substrate 1 are disposed in the pixel region A3.

In some embodiments, a pixel accommodation hole is formed in the pixel defining layer 9, and the display substrate further includes: an organic functional layer 12 in the pixel accommodation hole, a second electrode 13 on a side of the organic functional layer 12 facing away from the base substrate 1, and an encapsulation layer 17 on a side of the second electrode 13 facing away from the base substrate 1.

The first electrode 11, the organic functional layer 12 and the second electrode 13 which are stacked in the region of each pixel accommodation hole form an organic light-emitting diode (OLED) 10. The organic functional layer 12 includes at least an organic light-emitting layer, and may optionally include an electron transport layer, a hole transport layer, an electron block layer, a hole block layer, and the like. The respective film layers in the organic functional layer 12 may be formed by an IJP process, an evaporation process, or the like. The specific processes are not described herein in detail.

The encapsulation layer 17 generally includes an organic encapsulation sub-layer 19 and inorganic encapsulation sub-layers 18*a* and 18*b* that are alternately disposed. Illustratively, the encapsulation layer 17 has a three-layer stack structure, which specifically includes: two inorganic encapsulation sub-layers 18*a* and 18*b*, and an organic encapsulation sub-layer 19 between the two inorganic encapsulation sub-layers 18*a* and 18*b*.

FIG. 5 is another schematic cross-sectional view of a portion of the pixel region according to an embodiment of the present disclosure. As shown in FIG. 5, unlike the case shown in FIG. 4, the stack structure of film layers in the pixel region A3 shown in FIG. 5 includes one layer of gate electrode 15*a*, one capacitor plate layer 15*b*, two gate insulating layers 6*a* and 6*b*, two interlayer dielectric layers 7*a* and 7*b*, two layers of source/drain electrodes 16*a* and 16*b*, and two planarization layers 8*a* and 8*b*. Among them, a capacitor plate in the capacitor plate layer 15*b* can form a capacitor with another capacitor substrate C1 in another layer (the case where another capacitor substrate C1 and the gate electrode 15*a* are disposed in the same layer is exemplarily shown in the figure).

Figure 6:
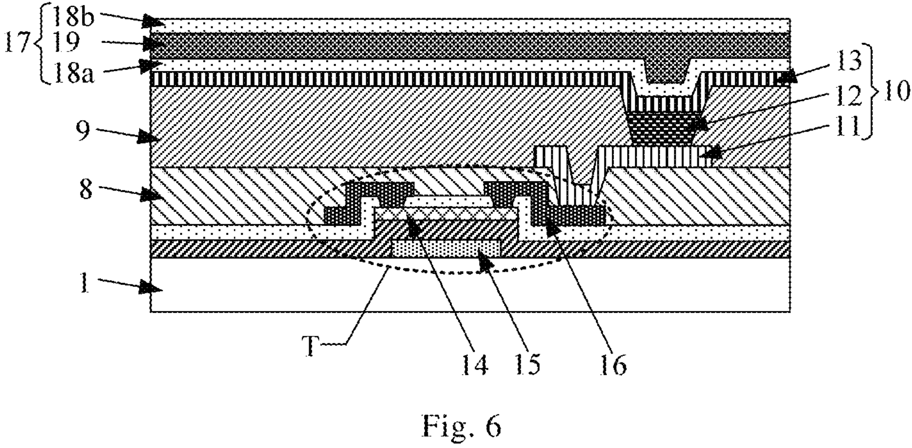
FIG. 6 is yet another schematic cross-sectional view of a portion of the pixel region according to an embodiment of the present disclosure.

FIG. 6 is yet another schematic cross-sectional view of a portion of the pixel region according to an embodiment of the present disclosure. As shown in FIG. 6, the thin film transistor T is of bottom gate type, i.e., the gate electrode 15 of the thin film transistor T is located between an active layer 14 and the base substrate 1, unlike the thin film transistor T of top gate type shown in FIGS. 4 and 5.

Figure 7:
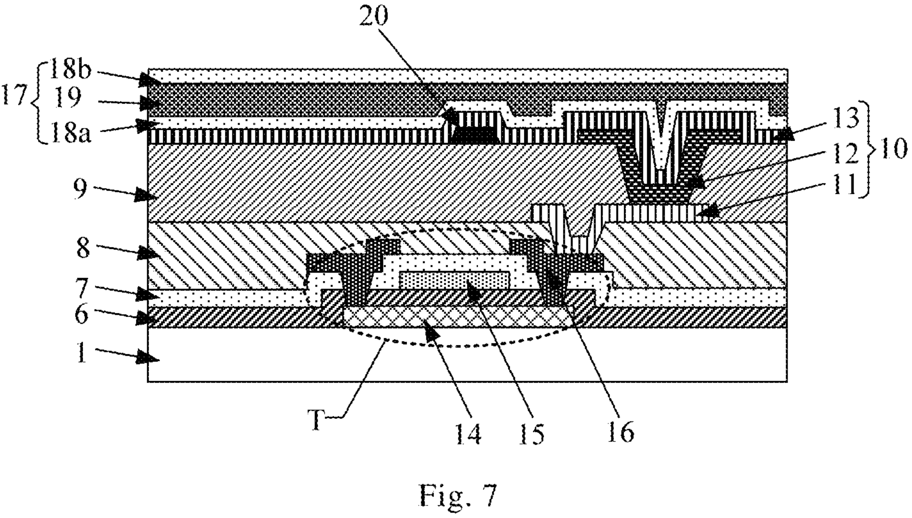
FIG. 7 is still another schematic cross-sectional view of a portion of the pixel region according to an embodiment of the present disclosure.

FIG. 7 is still another schematic cross-sectional view of a portion of the pixel region according to an embodiment of the present disclosure. As shown in FIG. 7, unlike the cases shown in FIGS. 4 to 6, a spacer dam 20 (PS dam) is disposed on a side of the pixel defining layer 9 facing away from the base substrate 1 in the case shown in FIG. 7, and the spacer dam is intended to support a fine metal mask (FMM) for use in evaporation in the process of forming the organic functional layer 12.

In the case shown in FIG. 7, the organic functional layer 12 is formed by an evaporation process. In the evaporation process, since the FMM is located on the spacer dam, a certain gap exists between the FMM and the pixel defining layer 9, so that the organic functional material is deposited not only in the pixel accommodation hole, but also on the surface of the pixel defining layer and around the periphery of the pixel accommodation hole.

It should be noted that in a case where no PS dam is disposed on the pixel defining layer 9, the organic functional layer 12 may also be formed by an evaporation process. In the embodiments of the present disclosure, the correspondence between the TFT type and the process (an evaporation process or an IJP process) adopted to form the organic functional layer 12 is not limited.

In some embodiments, the organic functional layer may also be laid in a full layer, which is not shown in the drawing.

In each of the above examples, a gate insulating layer 6 is disposed between the gate electrode 15 and the active layer 14, and an interlayer dielectric layer 7 is disposed between the source/drain electrode 16 and the active layer 14.

It should be noted that the stack structures of film layers in the pixel region A3 shown in FIGS. 4 to 7 are only some optional implementations of the technical solutions of the present disclosure, and do not limit the technical solutions of the present disclosure. In the technical solutions of the present disclosure, the stack structure of film layers in the pixel region A3 may also be in other forms, which are not described here by way of example.

Figure 8A:
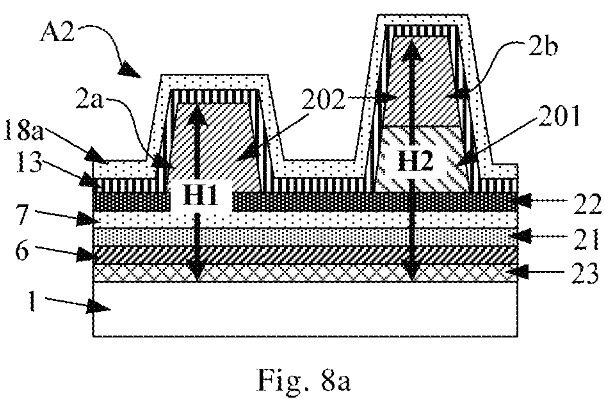
FIG. 8*a* is another schematic cross-sectional view taken along line A-A' in FIG. 2*b;*
Figure 8B:
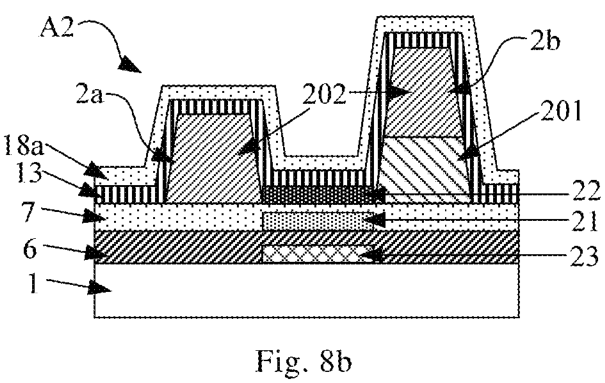
FIG. 8*b* is another schematic cross-sectional view taken along line A-A' in FIG. 2*b;*
Figure 9A:
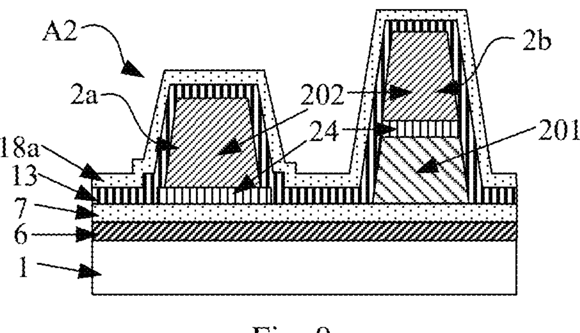
FIG. 9*a* is yet another schematic cross-sectional view taken along line A-A' in FIG. 2*b;*
Figure 9B:
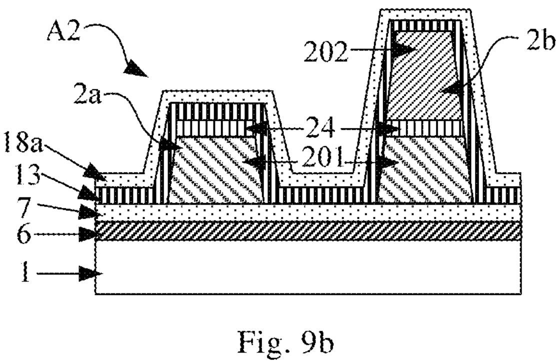
FIG. 9*b* is still another schematic cross-sectional view taken along line A-A' in FIG. 2*b;*
Figure 10:
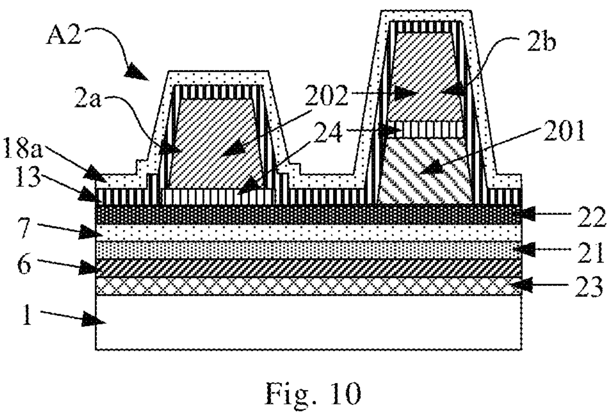
FIG. 10 is still another schematic cross-sectional view taken along line A-A' in FIG. 2*b;*

FIG. 8*a* is another schematic cross-sectional view taken along line A-A' in FIG. 2*b*, FIG. 8*b* is another schematic cross-sectional view taken along line A-A' in FIG. 2*b*, FIG. 9*a* is yet another schematic cross-sectional view taken along line A-A' in FIG. 2*b*, FIG. 9*b* is still another schematic cross-sectional view taken along line A-A' in FIG. 2*b*, and FIG. 10 is still another schematic cross-sectional view taken along line A-A' in FIG. 2*b*. As shown in FIGS. 8-10, the ink-jet printing dam includes: a first deposition film layer 201 and/or a second deposition film layer 202. The first deposition film layer 201 is made of the same material and disposed in the same layer as the planarization layer 8; and the second deposition film layer 202 is made of the same material and disposed in the same layer as the pixel defining layer 9.

It should be noted that, in the embodiments of the present disclosure, two structures that are made of a same material and disposed in a same layer means the two structures may be formed by performing one patterning process with the same material film, i.e. the two structures may be formed in the same patterning process. The patterning process in the embodiments of the present disclosure specifically refers to some or all of the process steps including photoresist coating, exposure, development, thin film etching, photoresist stripping, and the like.

In the embodiments shown in FIGS. 8*a* to 10, the case where the ink-jet printing dam 2 includes a first ink-jet printing sub-dam 2*a* and a second ink-jet printing sub-dam 2*b* is exemplarily shown. The second ink-jet printing sub-dam 2*b* surrounds the opening region, and the first ink-jet printing sub-dam 2*a* is located on a side of the second ink-jet printing sub-dam 2*b* facing away from the opening region and surrounds the second ink-jet printing sub-dam 2*b*. A first distance H1 is provided between a surface of the first ink-jet printing sub-dam 2*a* facing away from the base substrate 1 and the base substrate 1, a second distance H2 is provided between a surface of the second ink-jet printing sub-dam 2*b* facing away from the base substrate 1 and the base substrate 1, and the first distance H1 is smaller than the second distance H2 (that is, the height of the first ink-jet printing sub-dam 2*a* is smaller than that of the second ink-jet printing sub-dam 2*b*). The design of two ink-jet printing sub-dams 2*a* and 2*b* can achieve a better ink blocking effect.

In the cases shown in FIGS. 8*a*, 8*b*, 9*a* and 10, the first ink-jet printing sub-dam 2*a* includes the second deposition film layer 202, and the second ink-jet printing sub-dam 2*b* includes the first deposition film layer 201 and the second deposition film layer 202. In the case shown in FIG. 9*b*, the first ink-jet printing sub-dam 2*a* includes the first deposition film layer 201, and the second ink-jet printing sub-dam 2*b* includes the first deposition film layer 201 and the second deposition film layer 202.

It should be understood by those skilled in the art that one or more ink-jet printing dams 2 may be disposed, and the number and structure of the ink-jet printing dams 2 may be designed according to actual needs. In addition, the structures of the respective ink-jet printing dams 2 may be the same or different. Since there is high requirement on thickness of the ink-jet printing dam 2, the ink-jet printing dam 2 is often formed by stacking organic material films of a large thickness, such as a material film layer for forming the planarization layer 8 and a material film layer for forming the pixel defining layer 9.

It should be noted that the organic functional layer 12, the second electrode 13 (cathode of the OLED), the inorganic encapsulation sub-layer 18*a*, and the inorganic encapsulation sub-layer 18*b* may be laid in full layers and would cover over the ink-jet printing sub-dams 2*a* and 2*b* in the transition region A2, with the organic functional layer 12 being in direct contact with the surfaces of the ink-jet printing sub-dams 2*a* and 2*b* (not shown in the drawing). If the organic functional layer 12 is not laid in a full layer while the second electrode 13, the inorganic encapsulation sub-layer 18*a*, and the inorganic encapsulation sub-layer 18*b* are laid in full layers, and the organic functional layer 12 does not cover the transition region A2, the second electrode 13 is in direct contact with the surfaces of the ink-jet printing sub-dams 2*a* and 2*b* (see FIGS. 8*a* to 10, where the inorganic encapsulation sub-layer 18*b* is not shown), the inorganic encapsulation sub-layer 18*a* covers over the surface of the second electrode 13, and the inorganic encapsulation sub-layer 18*b* covers over the surface of the inorganic encapsulation sub-layer 18*a*. If neither the organic functional layer 12 nor the third electrode 13 is laid in a full layer while the inorganic encapsulation sub-layer 18*a* and the inorganic encapsulation sub-layer 18_b_ are laid in full layers, the inorganic encapsulation sub-layer 18_a_ is in direct contact with the surfaces of the ink-jet printing sub-dams 2_a_ and 2_b_, and the inorganic encapsulation sub-layer 18_b_ covers over the surface of the inorganic encapsulation sub-layer 18_a_.

In the embodiments of the present disclosure, the conductive film layer 5 may be classified into a first conductive film layer and a second conductive film layer according to different ways in which the conductive film layer 5 reduces the heat on the ink-jet printing sub-dams 2_a_ and 2_b_. FIG. 8 shows a case where only the first conductive film layer is disposed, FIGS. 9_a_ and 9_b_ show a case where only the second conductive film layer is disposed, and FIG. 10 shows a case where both the first conductive film layer and the second conductive film layer are disposed. The first conductive film layer and the second conductive film layer will be described in detail below.

Referring to FIGS. 8_a_, 8_b_ and 10, the first conductive film layer is located between the ink-jet printing sub-dams 2_a_ and 2_b_ and the base substrate 1. The first conductive film layer can block and absorb part of laser (energy) in the laser lift-off process, so that the energy reaching the ink-jet printing sub-dams 2_a_ and 2_b_ is reduced. The first conductive film layer may be made of a heat conductive material with a strong light shielding performance or a strong heat absorption capacity, such as a metal material or a polycrystalline material.

In some embodiments, the first conductive film layer may be made of the same material and disposed in the same layer as any one of the gate electrode 15, the source/drain electrode 16, and the active layer 14 in the thin film transistor T. For convenience of description, the first conductive film layer which is made of the same material and disposed in the same layer as the gate electrode 15 in the thin film transistor T is referred to as a first film layer 21, the first conductive film layer which is made of the same material and disposed in the same layer as the source/drain electrode 16 in the thin film transistor T is referred to as a second film layer 22, and the first conductive film layer which is made of the same material and disposed in the same layer as the active layer 14 in the thin film transistor T is referred to as a third film layer 23.

In the related art, the gate electrode 15 and the source/drain electrode 16 (including the source electrode and the drain electrode) in the thin film transistor T are both made of metal materials (e.g., metals such as aluminum, molybdenum, and copper, or alloys thereof), which have a better light shielding performance and a better heat conduction performance. The active layer 14 in the thin film transistor T may be made of a polycrystalline semiconductor material, which has a better heat absorption performance and a better heat conduction performance. Accordingly, the first conductive film layer may be formed from at least one of a metal material film layer for forming the gate electrode 15, a metal material film layer for forming the source/drain electrode 16, and a polycrystalline semiconductor material film layer for forming the active layer 14. Therefore, the first conductive film layer may be formed from a material film in the existing process, which can improve the utilization rate of the material film.

It should be noted that FIG. 8_a_ exemplarily shows three first conductive film layers which are the first film layer 21, the second film layer 22 and the third film layer 23, respectively. The design of a plurality of first conductive film layers can effectively enhance the heat conduction effect. It should be understood by those skilled in the art that only one or two first conductive film layers (only one or two of the first film layer 21, the second film layer 22 and the third film layer 23) may be disposed in the present disclosure, which is not described herein by way of example.

In addition, when a capacitor plate layer is disposed in the pixel region A3 (for example, as shown in FIG. 5), the first conductive film layer may be selected not only from the first film layer, the second film layer and the third film layer, but also a fourth film layer. The fourth film layer is made of the same material (generally, the same material as the gate electrode 15) and disposed in the same layer as the capacitor plate layer. The case where the first conductive film layer is the fourth film layer is not shown in the drawing.

In addition, when two layers of source/drain electrodes 16 are disposed in the pixel region A3 (for example, as shown in FIG. 5), the second film layer 22 may be of a single-layer structure or a double-layer structure. The case where the second film layer 22 is of a double-layer structure is not shown in the drawing.

Referring to FIG. 8_b_, the first ink-jet printing sub-dam 2_a_ and the second ink-jet printing sub-dam 2_b_ are disposed apart from each other, and the ink-jet printing dam further includes: a region between the first ink-jet printing sub-dam 2_a_ and the second ink-jet printing sub-dam 2_b_; the orthographic projection of the conductive film layer on the base substrate 1 is located between the orthographic projection of the first ink-jet printing sub-dam 2_a_ on the base substrate 1 and the orthographic projection of the second ink-jet printing sub-dam 2_b_ on the base substrate 1.

Illustratively, the orthographic projection of the first conductive film layer on the base substrate 1 is located between the orthographic projections of the two ink-jet printing sub-dams 2_a_ and 2_b_ on the base substrate, without overlapping with the orthographic projections of the ink-jet printing sub-dams 2_a_ and 2_b_ on the base substrate 1. In this case, the first conductive film layer can also block part of the light to some extent, so that the amount of heat absorbed by the two ink-jet printing sub-dams 2_a_ and 2_b_ is reduced.

FIG. 8_b_ exemplarily shows a case where the orthographic projections of three first conductive film layers (the first film layer 21, the second film layer 22 and the third film layer 23, respectively) on the base substrate 1 are located between the orthographic projections of the two ink-jet printing sub-dams 2_a_ and 2_b_ on the base substrate.

Referring to FIGS. 9_a_, 9_b_ and 10, the second conductive film layer 24 is located on a side of the ink-jet printing dam facing away from the base substrate and is in direct contact with a surface of the ink-jet printing dam facing away from the base substrate, or is located in the middle of the ink-jet printing dam, or is located on a side of the ink-jet printing dam facing the base substrate and is in direct contact with a surface of the ink-jet printing dam facing the base substrate.

The second conductive film layer 24 is in direct contact with the ink-jet printing sub-dams 2_a_ and 2_b_, and heat conduction is achieved by direct contact so as to reduce the heat on the ink-jet printing sub-dams 2_a_ and 2_b_. The second conductive film layer 24 may be made of a heat conductive material having a large thermal conductivity (larger than the thermal conductivity of the ink-jet printing sub-dams 2_a_ and 2_b_), such as metal material.

In some embodiments, the second conductive film layer 24 is made of the same material and disposed in the same layer as the first electrode 11.

In the related art, the first electrode 11 serves as an anode of the organic light emitting diode 10, and may be formed of a metal material. Hence, the second conductive film layer 24 may be formed from the metal material film layer for forming the first electrode 11. Therefore, the second conductive film layer 24 may be formed from the material film in the existing process, which can effectively improve the utilization rate of the material film.

It should be noted that in the cases shown in FIGS. 9*a* and 10, the second conductive film layer 24 is located below the ink-jet printing sub-dam 2*a* and is in direct contact with a lower surface of the ink-jet printing sub-dam 2*a*, and the second conductive film layer 24 is located in the middle of the ink-jet printing sub-dam 2*b*. In the case shown in FIG. 9*b*, the second conductive film layer 24 is located above the ink-jet printing sub-dam 2*a* and is in contact with an upper surface of the ink-jet printing sub-dam 2*a*, and the second conductive film layer 24 is located in the middle of the ink-jet printing sub-dam 2*b*.

In addition, in the cases shown in FIGS. 9*a* and 10, the second conductive film layer 24 is located between the ink-jet printing sub-dam 2*a* and the base substrate 1 and is in direct contact with the lower surface of the ink-jet printing sub-dam 2*a*, so that it can block and absorb part of laser to reduce the heat on the ink-jet printing dam 2, and at the same time, heat conduction can be achieved by way of contact so as to reduce the heat on the ink-jet printing dam 2.

Figure 11:
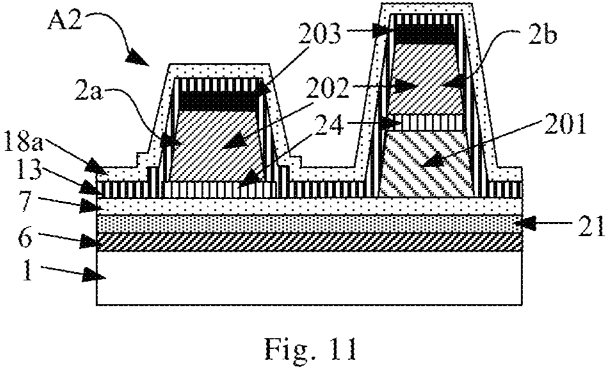
FIG. 11 is still another schematic cross-sectional view taken along line A-A' in FIG. 2*b*.

FIG. 11 is still another schematic cross-sectional view taken along line A-A' in FIG. 2*b*. As shown in FIG. 11, unlike the cases shown in FIGS. 8*a* to 10, the ink-jet printing sub-dams 2*a* and 2*b* shown in FIG. 11 include not only the first deposition film layer 201 and/or the second deposition film layer 202, but also a third deposition film layer 203, which is made of the same material and disposed in the same layer as the spacer dam 20.

It should be noted that FIG. 11 only exemplarily shows a case where the conductive film layer 5 includes one first conductive film layer (the first film layer 21) and one second conductive film layer 24.

In addition, in the transition region A2 shown in FIGS. 8*a* to 11 described above, the gate insulating layer 6 and the interlayer dielectric layer 7 between the ink-jet printing sub-dams 2*a* and 2*b* and the base substrate 1 may also be selectively removed.

The embodiments of the present disclosure provide a display substrate, in which by disposing a conductive film layer in the transition region and overlapping the orthographic projection of the conductive film layer on the base substrate with the orthographic projection of the ink-jet printing dam on the base substrate, in a laser lift-off process, due to the presence of the conductive film layer, which can absorb the surrounding heat, the heat absorbed by the ink-jet printing dam is reduced, then the heat on the ink-jet printing dam is reduced, and thus the amount of outgas of the ink-jet printing dam is reduced or even there is no outgas, thereby effectively avoiding a peeling phenomena of the film layer at the ink-jet printing dam, and improving the product yield.

Figure 12:
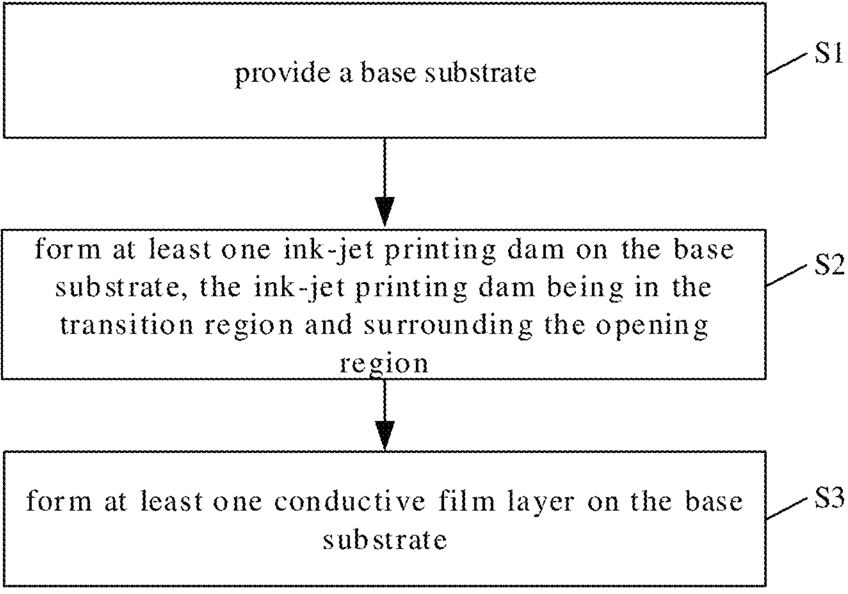
FIG. 12 is a flowchart of a method of manufacturing a display substrate according to an embodiment of the present disclosure.

FIG. 12 is a flowchart of a method of manufacturing a display substrate according to an embodiment of the present disclosure. As shown in FIG. 12, the manufacturing method is for manufacturing the display substrate according to the foregoing embodiments, and the manufacturing method includes: step S1, step S2 and step S3.

Step S1 includes providing a base substrate having an opening region, a transition region surrounding the opening region and a pixel region surrounding the opening region.

Step S2 includes forming at least one ink-jet printing dam on the base substrate. The ink-jet printing dam is located in the transition region and surrounds the opening region.

The ink-jet printing dam may be formed based on the existing processes of forming the planarization layer, the pixel defining layer and/or the spacer dam.

Step S3 includes forming at least one conductive film layer on the base substrate.

The conductive film layer is located in the transition region. An orthographic projection of the conductive film layer on the base substrate is overlapped with an orthographic projection of the ink-jet printing dam on the base substrate. The conductive film layer is intended to absorb and conduct heat so as to reduce the heat on the ink-jet printing dam.

The conductive film layer may be formed based on the existing processes of forming the gate electrode, the source/drain electrode, the active layer and the OLED anode.

Therefore, the sequence of performing steps S2 and S3 is not limited in the technical solutions of the present disclosure. Step S2 may be performed before or after step S3, or step S2 and step S3 may be performed alternately.

An embodiment of the present disclosure further provides a display device, including: a display substrate according to the foregoing embodiments. For specific description of the display substrate, reference may be made to the contents in the foregoing embodiments, which is not described herein again.

In some embodiments, the display device may be: an active-matrix organic light-emitting diode (AMOLED) display device, an electronic paper, an OLED display device, a mobile phone, a tablet computer, a television, a monitor, a notebook computer, a navigator, or any other products or components with a display function.

It should be understood that, the implementations described above are merely exemplary implementations for describing the principle of the present disclosure, but the present disclosure is not limited thereto. Various modifications and variations can be made by a person skilled in the art without departing from the spirit and the scope of the present disclosure. These modifications and variations should be considered to be within protection scope of the present disclosure.

What is claimed is:

1. A display substrate, comprising:

a base substrate having an opening region, a transition region surrounding the opening region and a pixel region surrounding the opening region;

at least one ink-jet printing dam in the transition region, the at least one ink-jet printing dam surrounding the opening region; and at least one conductive film layer in the transition region, wherein an orthographic projection of the conductive film layer on the base substrate is overlapped with an orthographic projection of the ink-jet printing dam on the base substrate, and at least a part of the at least one conductive film layer is on a side of the ink-jet printing dam facing away from the base substrate, wherein the at least one conductive film layer comprises a first film layer, a second film layer and a third film layer, and the first film layer, the second film layer and the third film layer stack at a side of the at least one ink-jet printing dam close to the base substrate and are spaced apart from each other.

2. The display substrate of claim 1, wherein the orthographic projection of the conductive film layer on the base substrate and the orthographic projection of the ink-jet printing dam on the base substrate are completely overlapped with each other; or the orthographic projection of the ink-jet printing dam on the base substrate is within a region enclosed by the orthographic projection of the conductive film layer on the base substrate; or an area of the orthographic projection of the conductive film layer on the base substrate is larger than an area of the orthographic projection of the ink-jet printing dam on the base substrate.

3. The display substrate of claim 1, further comprising:

a thin film transistor in the pixel region;

a planarization layer on a side of the thin film transistor facing away from the base substrate;

a first electrode on a side of the planarization layer facing away from the base substrate; and a pixel defining layer on a side of the first electrode facing away from the base substrate.

4. The display substrate of claim 3, wherein the ink-jet printing dam comprises: a first deposition film layer, which is made of the same material and disposed in the same layer as the planarization layer; and/or a second deposition film layer, which is made of the same material and disposed in the same layer as the pixel defining layer.

5. The display substrate of claim 4, further comprising:

a spacer dam on a side of the pixel defining layer facing away from the base substrate;

wherein the ink-jet printing dam further comprises:

a third deposition film layer, which is made of the same material and is disposed in the same layer as the spacer dam.

6. The display substrate of claim 4, wherein the first film layer is made of the same material and disposed in the same layer as a gate electrode of the thin film transistor, the second film layer is made of the same material and disposed in the same layer as a source/drain electrode of the thin film transistor, and the third film layer is made of the same material and disposed in the same layer as an active layer of the thin film transistor.

7. The display substrate of claim 4, wherein the at least one conductive film layer comprises: a conductive film layer, which is made of the same material and disposed in the same layer as the first electrode.

8. The display substrate of claim 4, wherein the at least one conductive film layer comprises: a second conductive film layer, which is made of the same material and disposed in the same layer as the first electrode.

9. The display substrate of claim 3, wherein a pixel accommodation hole is formed in the pixel defining layer, and the display substrate further comprises:

an organic functional layer in the pixel accommodation hole;

a second electrode on a side of the organic functional layer facing away from the base substrate; and an encapsulation layer on a side of the second electrode facing away from the base substrate.

10. The display substrate of claim 1, wherein the ink-jet printing dam comprises: a first ink-jet printing sub-dam and a second ink-jet printing sub-dam; and a first distance between a surface of the first ink-jet printing sub-dam facing away from the base substrate and the base substrate, is smaller than a second distance between a surface of the second ink-jet printing sub-dam facing away from the base substrate and the base substrate.

11. The display substrate of claim 10, wherein the first ink-jet printing sub-dam is spaced apart from the second ink-jet printing sub-dam, and the ink-jet printing dam further comprises: a region between the first ink-jet printing sub-dam and the second ink-jet printing sub-dam; and the orthographic projection of the conductive film layer on the base substrate is between an orthographic projection of the first ink-jet printing sub-dam on the base substrate and an orthographic projection of the second ink-jet printing sub-dam on the base substrate.

12. A display device, comprising a display substrate, wherein the display substrate comprises:

a base substrate having an opening region, a transition region surrounding the opening region and a pixel region surrounding the opening region;

at least one ink-jet printing dam in the transition region, the at least one ink-jet printing dam surrounding the opening region; and at least one conductive film layer in the transition region, wherein an orthographic projection of the conductive film layer on the base substrate is overlapped with an orthographic projection of the ink-jet printing dam on the base substrate, and at least a part of the at least one conductive film layer is on a side of the ink-jet printing dam facing away from the base substrate, wherein the at least one conductive film layer comprises a first film layer, a second film layer and a third film layer, and the first film layer, the second film layer and the third film layer stack at a side of the at least one ink-jet printing dam close to the base substrate and are spaced apart from each other.

13. The display device of claim 12, wherein the ink-jet printing dam comprises: a first ink-jet printing sub-dam and a second ink-jet printing sub-dam;

the second ink-jet printing sub-dam surrounds the opening region, and the first ink-jet printing sub-dam is on a side of the second ink-jet printing sub-dam facing away from the opening region and surrounds the second ink-jet printing sub-dam; and a first distance between a surface of the first ink-jet printing sub-dam facing away from the base substrate and the base substrate, is smaller than a second distance between a surface of the second ink-jet printing sub-dam facing away from the base substrate and the base substrate.

14. The display device of claim 12, wherein the display substrate further comprises:

a thin film transistor in the pixel region;

a planarization layer on a side of the thin film transistor facing away from the base substrate;

a first electrode on a side of the planarization layer facing away from the base substrate; and a pixel defining layer on a side of the first electrode facing away from the base substrate.

15. The display device of claim 14, wherein the ink-jet printing dam comprises:

a first deposition film layer, which is made of the same material and disposed in the same layer as the planarization layer; and/or a second deposition film layer, which is made of the same material and disposed in the same layer as the pixel defining layer.

16. The display device of claim 15, wherein the display substrate further comprises:

a spacer dam on a side of the pixel defining layer facing away from the base substrate; and the ink-jet printing dam further comprises:

a third deposition film layer, which is made of the same material and is disposed in the same layer as the spacer dam.

17. The display device of claim 15, wherein the first film layer is made of the same material and disposed in the same layer as a gate electrode of the thin film transistor, the second film layer is made of the same material and disposed in the same layer as a source/drain electrode of the thin film transistor, and the third film layer is made of the same material and disposed in the same layer as an active layer of the thin film transistor.

18. The display device of claim 17, wherein the at least one conductive film layer comprises: a second conductive film layer, which is made of the same material and disposed in the same layer as the first electrode.

19. The display device of claim 15, wherein the at least one conductive film layer comprises: a conductive film layer, which is made of the same material and disposed in the same layer as the first electrode.

20. A method of manufacturing a display substrate, wherein the display substrate is the display substrate of claim 1, and the method comprises:

providing a base substrate having an opening region, a transition region surrounding the opening region and a pixel region surrounding the opening region;

forming at least one ink-jet printing dam on the base substrate, the ink-jet printing dam being in the transition region and surrounding the opening region; and forming at least one conductive film layer on the base substrate, the least one conductive film layer being in the transition region, wherein an orthographic projection of the conductive film layer on the base substrate is overlapped with an orthographic projection of the ink-jet printing dam on the base substrate, wherein the at least one conductive film layer comprises a first film layer, a second film layer and a third film layer, and the first film layer, the second film layer and the third film layer stack at a side of the at least one ink-jet printing dam close to the base substrate and are spaced apart from each other.

* * * * *